United States Patent [19]

Schaefer

[11] Patent Number: 5,636,173
[45] Date of Patent: Jun. 3, 1997

[54] AUTO-PRECHARGE DURING BANK SELECTION

[75] Inventor: Scott Schaefer, Boise, Id.

[73] Assignee: Micron Technology, Inc., Boise, Id.

[21] Appl. No.: 480,154

[22] Filed: Jun. 7, 1995

[51] Int. Cl.$^6$ .................................................. G11C 8/00
[52] U.S. Cl. .......................... 365/230.03; 365/189.05; 365/203; 365/222; 365/233
[58] Field of Search .......................... 365/230.03, 203, 365/233, 222, 189.05

[56] References Cited

U.S. PATENT DOCUMENTS

| | | | |
|---|---|---|---|
| 4,667,313 | 5/1987 | Pinkham et al. | 365/230.03 |
| 5,208,779 | 5/1993 | Walther et al. | 365/222 |
| 5,229,969 | 7/1993 | Lee et al. | 365/222 |
| 5,229,970 | 7/1993 | Lee et al. | 365/222 |
| 5,257,233 | 10/1993 | Schaefer | 365/227 |
| 5,335,201 | 8/1994 | Walther et al. | 365/222 |
| 5,412,613 | 5/1995 | Galbi et al. | 365/230.03 |
| 5,493,535 | 2/1996 | Cho | 365/203 |

Primary Examiner—Son T. Dinh
Attorney, Agent, or Firm—Schwegman, Lundberg, Woessner & Kluth, P.A.

[57] ABSTRACT

A synchronous dynamic random access memory (SDRAM) is responsive to command signals and includes a first bank memory array and a second bank memory array. A command decoder/controller responds to command signals to initiate, in a first system clock cycle, an active command controlling an active operation on the first bank memory array and to initiate, in a second system clock cycle, a transfer read or write command controlling a read or write transfer operation for transferring data from or to the first bank memory array. The command controller responds to the active command to automatically initiate, in the second system clock cycle, a precharge command controlling a precharge operation on the second bank memory array.

42 Claims, 5 Drawing Sheets

FIG. 5

| | T1 | T2 | T3 | T4 | T5 | T6 | T7 | T8 | T9 | T10 | T11 | T12 | T13 | T14 | T15 | T16 | T17 | T18 |
|---|---|---|---|---|---|---|---|---|---|---|---|---|---|---|---|---|---|---|
| BANK 0 COMMAND | ACTIVE | | READ | | | | PRECHG | | | | ACTIVE | | READ | | | | PRECHG | |
| BANK 0 DATA-OUT | | | | | m | m+1 | m+2 | m+3 | | | | | | | m | m+1 | m+2 | m+3 |
| BANK 1 COMMAND | | | | | ACTIVE | | | READ | | | | PRECHG | | | ACTIVE | | | READ |
| BANK 1 DATA-OUT | | | | | | | | | | m | m+1 | m+2 | m+3 | | | | | |

FIG. 6

| | T1 | T2 | T3 | T4 | T5 | T6 | T7 | T8 | T9 | T10 | T11 | T12 | T13 | T14 | T15 | T16 | T17 | T18 |
|---|---|---|---|---|---|---|---|---|---|---|---|---|---|---|---|---|---|---|
| BANK 0 COMMAND | ACTIVE | | READ | | | | AUTO–PRECHARGE | | | ACTIVE | | READ | | | | | | |
| BANK 0 DATA-OUT | | | | | m | m+1 | m+2 | m+3 | | | | | | m | m+1 | m+2 | m+3 | |
| BANK 1 COMMAND | | | | | ACTIVE | | READ | | | | PRECHG | | | ACTIVE | | READ | | |
| BANK 1 DATA-OUT | | | | | | | | | m | m+1 | m+2 | m+3 | | | | | | m |

AUTO-PRECHARGE DURING BANK SELECTION

THE FIELD OF THE INVENTION

The present invention relates semiconductor memory integrated circuits and, more particularly to synchronous dynamic random access memories.

BACKGROUND OF THE INVENTION

A synchronous dynamic random access memory (SDRAM) is designed to operate in a synchronous memory system. Thus, all input and output signals, with the exception of a clock enable signal during power down and self refresh modes, are synchronized to an active edge of a system clock.

SDRAMs offer substantial advances in dynamic memory operating performance. For example, some SDRAMs are capable of synchronously providing burst data in a burst mode at a high-speed data rate by automatically generating a column address to address a memory array of storage cells organized in rows and columns for storing data within the SDRAM. In addition, if the SDRAM includes two or more banks of memory arrays, the SDRAM preferably permits interleaving between the two or more banks to hide precharging time.

In an asynchronous DRAM, once row and column addresses are issued to the DRAM and a row address strobe signal and column address strobe signal are deactivated, the DRAM's memory is precharged and available for another access. Another row cannot be accessed in the DRAM array, however, until the previous row access is completed.

By contrast, a SDRAM requires separate commands for accessing and precharging a row of storage cells in the SDRAM memory array. Once row and column addresses are provided to a SDRAM in a SDRAM having multiple bank memory array's, a bank memory array which is accessed remains active. An internally generated row address strobe remains active and the selected row is open until a PRE-CHARGE command deactivates and precharges the selected row of the memory array.

In a SDRAM, a transfer operation involves performing a PRECHARGE command operation to deactivate and precharge a previously accessed bank memory array, performing an ACTIVE command operation to register the row address and activate the bank memory array to be accessed in the transfer operation, and performing the transfer READ or WRITE command to register the column address and initiate a burst cycle.

In SDRAM's with two bank memory arrays, interleaving between two open bank memory arrays increases the probability of "Page Hits." The interleaving between open bank memory arrays coupled with the high-speed burst mode may, in many cases, provide a "seamless" flow of data. Nevertheless, in a typical SDRAM an extra dead cycle or wait cycle is required when interleaving between bank memory arrays when performing read or write operations comprising random accesses wherein new pages are accessed. Thus, there is a need to reduce and improve the cycle time on random interleave accesses to eliminate the extra dead cycle during read or write operations.

SUMMARY OF THE INVENTION

The present invention provides a memory device responsive to command signals and operating in synchronization with active edges of a system clock. The memory device includes a first bank memory array and a second bank memory array each having storage cells organized in rows and columns for storing dam. A command decoder/controller responds to selected command signals to initiate, at a first active edge of the system clock, a first command controlling a fast operation on the fast bank memory array and to initiate, at a second active edge of the system clock, a transfer command controlling a transfer operation for transferring data to or from the first bank memory array. The command decoder/controller responds to the fast command to automatically initiate at the second active edge of the system clock, a third command controlling a third operation on the second bank memory array.

In one preferred embodiment of the present invention, the memory device is a synchronous dynamic random access memory (SDRAM). The SDRAM of the present invention preferable includes a programmable mode register for storing defined mode information. The command controller initiates the third command in response to the fast command based on the defined mode information.

In one preferred embodiment of the present invention, the first command is an active command and the fast operation includes latching a value representing a row address of the first bank memory array and activating the addressed row of storage cells in the fast bank memory array. In one implementation of this preferred embodiment, the third Command is initiated based on the active command to the first bank memory array being initiated during a second bank transfer operation for transferring data to or from the second bank memory array. Alternatively, the active command is a special type of two types active commands including a special type and normal type. The normal type active command does not trigger the automatic initiation of the third command, and the special type active command does trigger the automatic initiation of the third command.

In one preferred embodiment of the present invention, the third command is a precharge command and the third operation includes precharging and deactivating the second bank memory array. The transfer command can be a read command or a write command.

BRIEF DESCRIPTION OF THE DRAWINGS

FIG. 5 is a simplified timing diagram illustrating the operation of a prior art SDRAM during interleaving between bank memory arrays during random accesses.

FIG. 6 is a simplified timing diagram illustrating the SDRAM according to the present invention during interleaving between bank memory arrays during random accesses.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
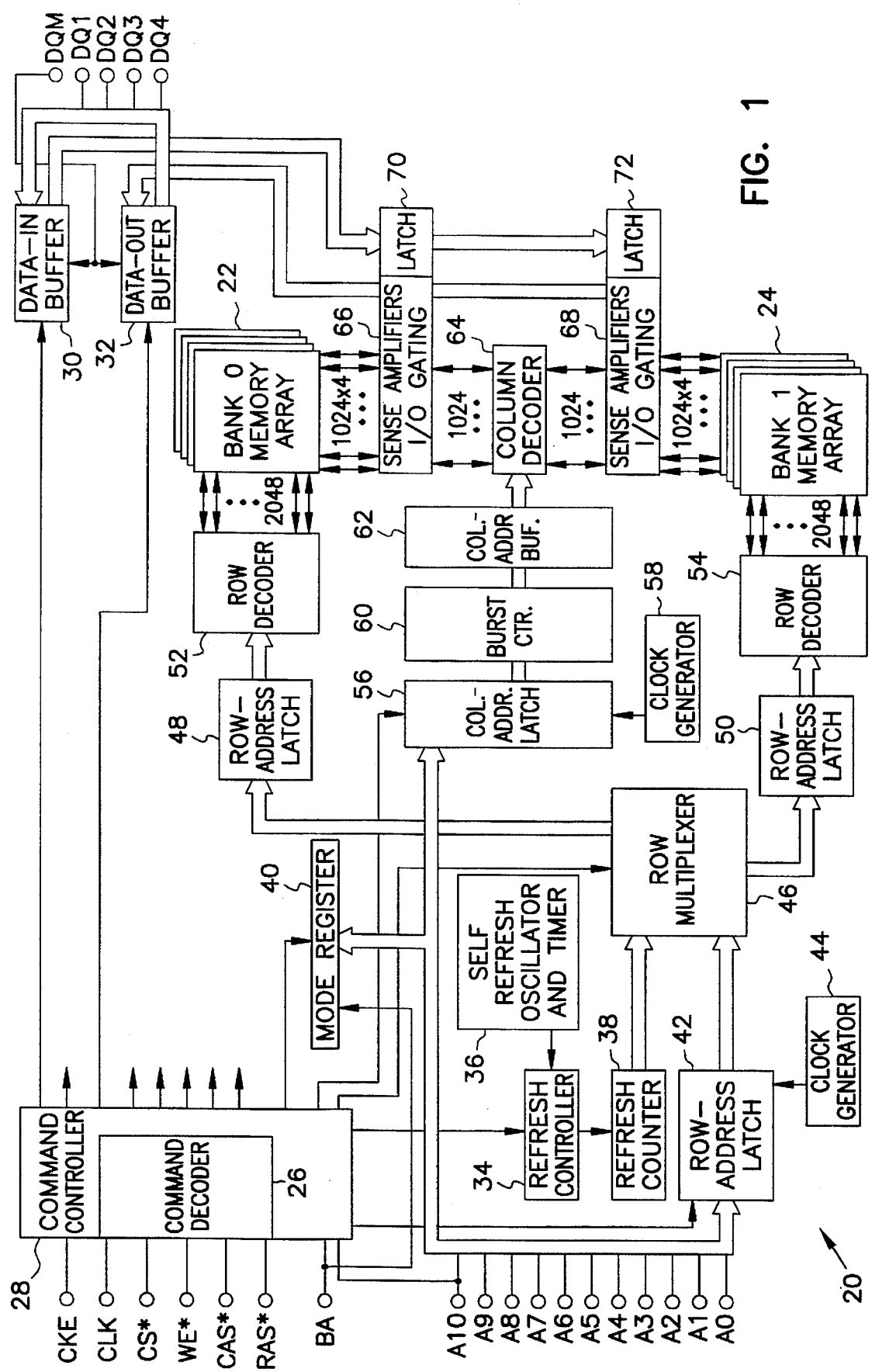
FIG. 1 is a block diagram of a SDRAM according to the present invention.

A synchronous dynamic random access memory (SDRAM) according to the present invention is illustrated generally at 20 in FIG. 1 in block diagram form. Much of the circuitry of SDRAM 20 is similar to circuitry in known SDRAMs, such as the Micron Technology, Inc. MT48LC4M4R1 S 4 MEG X 4 SDRAM, which is described in detail in the corresponding Micron Technology, Inc. Functional Specification, which is incorporated herein by reference. SDRAM 20 includes a bank 0 memory array 22 and of bank 1 memory array 24 which both comprise storage cells organized in rows and columns for storing data. In one embodiment of SDRAM 20, each bank memory array comprises four separate arrays of 2048 rows×1024 columns.

As is illustrated in FIG. 1, power is supplied to SDRAM 20 pins Vcc and Vss. A typical SDRAM 20 provides optimum memory performance in a low voltage environment such as a 3.3 V environment. A system clock (CLK) signal is provided through a CLK input pin and a clock enable signal (CKE) is provided through a CKE input pin to SDRAM 20. The CLK signal is activated and deactivated based on the state of the CKE signal. All the input and output signals of SDRAM 20, with the exception of the CKE input signal during power down and self refresh modes, are synchronized to the active going edge (the positive going edge in the embodiment illustrated in FIG. 1) of the CLK signal.

A chip select (CS*) input pin inputs a CS* signal which enables, when low, and disables, when high a command decode 26. Command decode 26 is included in a command controller 28. Command decode 26 receives control signals including a row address strobe (RAS*) signal on a RAS* pin, column address strobe (CAS*) signal on a GAS* pin, and a write enable (WE*) signal on a WE* pin. Command decoder 26 decodes the RAS*, CAS*, and WE* signals to place command controller 28 in a particular command operation sequence. Command controller 28 controls the various circuitry of SDRAM 20 based on decoded commands such as during controlled reads or writes from or to bank 0 memory array 22 and bank 1 memory array 24. A bank address (BA) signal is provided on a BA input pin to define which bank memory array should be operated on by certain commands issued by command controller 28.

Address inputs bits are provided on input pins A0–A10. As described below, both the row and column address input bits are provided on the address input pins. During write transfer operations, data is supplied to SDRAM 20 via input/output pins (DQ1–DQ-4). During read transfer operations, data is clocked out of SDRAM 20 via input/output pins DQ1–DQ-4. An input/output mask signal is provided on a DQM input pin to provide non-persistent buffer control for a data-in-buffer 30 and a data-out buffer 32.

SDRAM 20 must be powered-up and initialized in a predefined manner. In addition, both bank 0 and bank 1 memory arrays 22 and 24 must be precharged and placed in an idle state. The precharging of the bank memory arrays is preformed with a precharge command operation which is described in more detail below. Once in the ideal state, two AUTO-REFRESH operations must be performed. Two refresh commands are typically available in SDRAM 20 which are an AUTO-REFRESH command and a SELF-REFRESH command. The AUTO-REFRESH and SELF-REFRESH commands are performed with refresh controller 34, self-refresh oscillator and timer 36, and refresh counter 38 in a manner known in the art to refresh the memory arrays. Once the two AUTO-REFRESH operations are performed, SDRAM 20 is available for programming of a mode register 40. Mode register 40 is assumed to have an unknown state when SDRAM 20 is powered up. Consequently, before performing any operational command, mode register 40 must be set or programmed.

Mode register 40 is typically a persistent register wherein once programmed, the mode register retains the program op-code until the mode register is reprogrananed or SDRAM 20 loses power. Most of the possible programmable options of SDRAM 20 are defined in the op-codes stored in mode register 40. Typically mode register 40 is programmed by providing a desired op-code via the BA input pins and the A0–A10 address inputs, in conjunction with a SET MODE REGISTER command determined by CS*, RAS*, CAS*, and WE* being registered low.

A valid ACTIVE command is initiated by command controller 28 with the CS* and RAS* signals low with the CAS* and WE* signals high on a rising edge of the CLK signal. During the ACTIVE command the state of the BA signal determines which bank memory array to activate and address. During the ACTIVE command a value representing a row address of the selected bank memory array, as indicated by address bits on input pins A0–A10, is latched in a row address latch 42 in response to a clock signal generated from a clock generator circuit 44. The latched row address is provided to a row multiplexor 46 which provides a row address to row address buffers 48 to be provided to bank 0 memory array 22 or row address buffers 50 to be provided to bank 1 memory array 24 depending on the state of the BA signal. A row decoder 52 decodes the row address provided from row address buffers 48 to activate one of the 2,048 lines corresponding to the row address for read or write transfer operations, to thereby activate the corresponding row of storage cells in bank 0 memory array 22. Row decoder 54 similarly decodes the row address in row address buffer 50 to activate one of the 2,048 lines to bank 1 memory array 24 corresponding to the row address for read or write transfer operations, to thereby activate the corresponding row of storage cells in bank 1 memory array 24. In order to access a row once a row in the selected bank memory has been activated with the ACTIVE command, a bank memory array must be precharged with the below described PRECHARGE command or AUTO-PRECHARGE command before another ACTIVE command is applied to the bank memory array.

A valid READ command is initiated with the CS* and CAS* signals low, and the RAS* and WE* signals high on a rising edge of the CLK signal. The READ command from command controller 28 controls a column address latch 56 which receives address bits A0–A9 and holds a value representing a column address of the bank memory array selected by the BA signal at the time the READ command is initiated. Column address latch 56 latches the column address in response to a clock signal generated by a clock generator 58. Address pin A10 provides an input path for a command signal which determines whether or not an AUTO-PRECHARGE command, described in detail below, is to be initiated automatically after the READ command. The READ command provided from command controller 28 also initiates a burst read cycle, described in detail below, by starting a burst counter 60.

A column address buffer 62 receives the output of the burst counter 60 to provide the current count of the column address to a column decoder 64. Column decoder 64 activates four of the 1,024×4 lines, provided to sense amplifiers and input/output (I/O) gating circuit 66 and sense amplifiers and I/O gating circuit 68 corresponding to the current column address. Sense amplifiers and I/O gating circuits 66 and 68 operate in a manner known in the art to seine the data stored in the storage cells addressed by the active row decoder line and the active column decoder lines to provide the selected four bit byte of data from either bank 0 memory array 22 or bank 1 memory array 24 respectively to data-out buffer 32 during a read operation. Data-out buffer 32 provides the selected four bit byte of data to input/output data pins DQ1–DQ4.

In a burst read having a length of four, the initial column address stored in column address latch 56 is used to activate sense amplifiers and I/O gating circuits 66 or 68 during the first burst cycle of the burst read operation. Then, during the next three clock cycles burst counter 60 counts up from the column address stored in column address latch 56, as defined by a sequence type, to "burst" or clock-out the next three memory locations of dam. A full-page burst will wrap around and continually restart the "burst" operation until a BURST TERMINATION command or PRECHARGE command is indicated by command controller 28 or until interrupted with another burst operation.

A valid WRITE command is initiated with the CS*, CAS*, and WE* signals low and the RAS* signal high on the rising edge of the CLK signal. The WRITE command provided from command controller 28 controls clock generator 58 to clock column address latch 55 which receives and holds a value representing a column address of the bank memory array selected by the state of the BA signal at the time the WRITE command is initiated, as indicated by the address provided on address input pins A0–A9. As with the read operation, during the WRITE command, address pin A10 provides the additional feature to select whether or not the below described AUTO-PRECHARGE command is to be initiated following the WRITE command. Burst counter 50 initiates the burst write cycle. Column address buffer 62 receives the output of the burst counter 60 and provides the current column address to column decoder 64. Column decoder 64 activates four of the 1,024×4 lines to sense amplifiers and I/O gating circuits 66 and 68 corresponding to the column address to indicate where the incoming four bit byte of data is to be stored in either bank 0 memory array 22 or bank 1 memory array 24.

During WRITE command operations data is provided on input/output pins DQ1–DQ4 to data-in buffer 30. Data in buffer 30 provides the input write data to a latch 70 corresponding to bank 0 memory array 22 and a latch 72 corresponding to bank 1 memory array 24. The four bit byte of input write data is provided from latch 70 or 72 to the selected bank memory array with seine amplifiers and I/O gating circuits 66 or 68 in a manner known in the art based on the activated four lines corresponding to the current column address.

During a burst write operation of length four, the first byte of data is stored at the memory array location addressed by the column address stored in column address latch 56. Similar to the read burst operation, during the next three clock cycles, burst counter 60 counts up from the column address stored in column latch 56, as defined by the sequence type, to "burst" or clock in the data to be stored in the next three memory locations. A full page burst will wrap around and continue writing data until terminated by the BURST TERMINATION command, PRECHARGE command, or until interrupted with another burst operation.

The burst read and write operation are controlled by the burst mode defined in mode register 40 which is programmable during the SET MODE REGISTER command. The burst operation provide for a continuous flow of data from or to the specified memory array location during read or write access. Burst lengths of 2, 4, 8, or full page (1,024) cycles are programmable into mode register 40 in one embodiment of SDRAM 20. In one embodiment of the present invention, a burst read/single write mode permits a write operation to be a burst length of one and yet allows the read operation to be the programmed burst length as defined in mode register 40.

In addition, a burst sequence is a programmable feature programmed into mode register 40 during the SET MODE REGISTER command. Typically two types of burst sequences are available for selection including a sequential sequence or an interleaving sequence. The sequential sequence bursts through sequential locations in one of the two bank memory arrays. The interleaving sequence interleaves between bank 0 memory array 22 and bank 1 memory array 24. In one embodiment of SDRAM 20, both the sequential and interleaving sequences support bursts of 2, 4, and 8 cycles. In this one embodiment, the sequential sequence supports full page length burst cycles.

Command controller initiates a valid PRECHARGE command with the CS*, WE*, and the RAS* signals low and the CAS* signal high on the positive going edge of the CLK signal. The PRECHARGE command operation deactivates and precharges the bank memory array selected by the state of the BA signal at the time the PRECHARGE command is initiated. In this way, the row previously accessed is deactivated and precharged so that row may be refreshed or another row accessed. Once a bank memory array has been precharged, that bank memory array is in an idle state and must be activated prior to another READ command or WRITE command being issued to that bank memory array. In the preferred embodiment of the SDRAM 20, multiple READ and WRITE commands do not require precharging between each command provided the same row is being accessed.

In a preferred embodiment of SDRAM 20, the PRECHARGE command allows either one or both banks to be precharged. Individual bank precharging is performed if the value on address input pin A10 is registered low at the time the PRECHARGE command is initiated. During individual bank precharging, the state of the BA signal defines which bank is precharged. Both banks are precharged when A10 is registered high at the time the PRECHARGE command is initiated. If A10 is registered high at the time the PRECHARGE command is initiated, BA is treated as a "don't care."

During any ACTIVE, READ, WRITE, or PRECHARGE command the bank memory array to be accessed is determined by the registering of the BA signal at the initiation of the command. Bank 0 memory array 22 is selected if the value of the BA signal is registered low and bank 1 memory array 24 is selected if the value of the BA signal is registered high. As described above, the BA signal determines the selection of one of the banks during a PRECHARGE command only when the value on input pin A10 is low. If the value on input pin A10 is high during the PRECHARGE command, BA becomes a "don't care."

When a row of a selected bank memory array is selected with an ACTIVE command that row of the bank memory array becomes activated and continues to remain active until a PRECHARGE command to that selected bank memory array is issued. In other words, the RAS* signal is only registered once externally, but an internally generated RAS* signal to the selected bank memory array remains active until a PRECHARGE command is provided. READ and WRITE commands do not necessarily require a PRECHARGE command to follow the command, but a bank memory array must be precharged prior to registering a new row address. When selecting a row within a bank memory array, the other bank memory array can remain active to permit READ and WRITE commands to interleave between the two bank memory arrays.

Precharging a bank memory array can, in most cases, be hidden due to the dual bank structure of SDRAM 20. To hide the precharging, a PRECHARGE command is issued to the bank memory array not being accessed while the bank memory array being accessed is in a burst mode.

During read operations within the same bank, much of the precharge $T_{RP}$ time can still be hidden when transitioning from one row to another. The PRECHARGE command may be initiated up to one clock cycle prior to the last data-out during a read operation, provided that the read latency is two or more clocks. When the read latency is one clock, the PRECHARGE command may only be issued when the final data-out is available. In any case, at least one clock cycle of the precharge time $T_{RP}$ must occur during the cycle the last data-out is being held valid. That is, one of two or two of three clock cycles of the precharge time may be hidden provided the read latency is two or more. Otherwise, only one precharge clock may be hidden.

WRITE commands require a write recovery time ($T_{WR}$) from the last data-in element to the beginning of the PRECHARGE command when the same bank memory array is going from a write command to a PRECHARGE command.

An AUTO-PRECHARGE command is a non-persistent feature in SDRAM 20 which performs all of the same individual bank precharge functions described above for the PRECHARGE command. The AUTO-PRECHARGE command feature of the preferred embodiment of SDRAM 20, permits a use to program a READ command or WRITE command that automatically performs a precharge upon the completion of the READ command or the WRITE command.

By using the AUTO-PRECHARGE command feature, a manual PRECHARGE command does not need to be issued during the functional operation of SDRAM 20. The AUTO-PRECHARGE command insures that the precharge is initiated at the earliest, valid stage within a burst cycle. The user is not allowed to issue another command until the precharged time ($t_{RP}$) is completed. Therefore, when an AUTO-PRECHARGE command is employed in SDRAM 20, the selected bank memory array must not be accessed again until $t_{RP}$, is complete. For example, if a read of two cycles is selected and three clock periods are required to satisfy $t_{RP}$ the bank memory array cannot be accessed during the two clocks following the completion of a burst operation. If a burst of four is programmed and three clock periods are required to satisfy $t_{RP}$, the bank memory array cannot be accessed during the one clock cycle following the completion of the burst, provided that the read latency is two or more clocks, otherwise, the bank memory array cannot be accessed during the two clocks following the completion of the burst cycle.

Write operations require the write recovery time ($T_{WR}$) from the last data-in element to the beginning of the PRECHARGE command when the same bank memory array is being accessed. Thus, the bank memory array cannot be reaccessed until $T_{WR}+t_{RP}$ from the last date-in element.

The read latency is a programmable feature of SDRAM 20 defined in mode register 40 during the SET MODE REGISTER command. Typically, read latencies of 1,2, or 3 clocks are available. The read latency guarantees at which clock the data will become available regardless of the system clock rate. Data can be made available on the input/output pins DQ1-DQ4 up to one clock cycle less than the read latency, depending on the frequency of the system clock. A read latency of two clocks programmed with a cycle rate which is greater than the minimum access time will provide data almost immediately after the first clock.

A no operation (NOP) command can be provided to SDRAM 20 to prevent other unwanted commands from being registered during idle or wait states.

Figure 2:
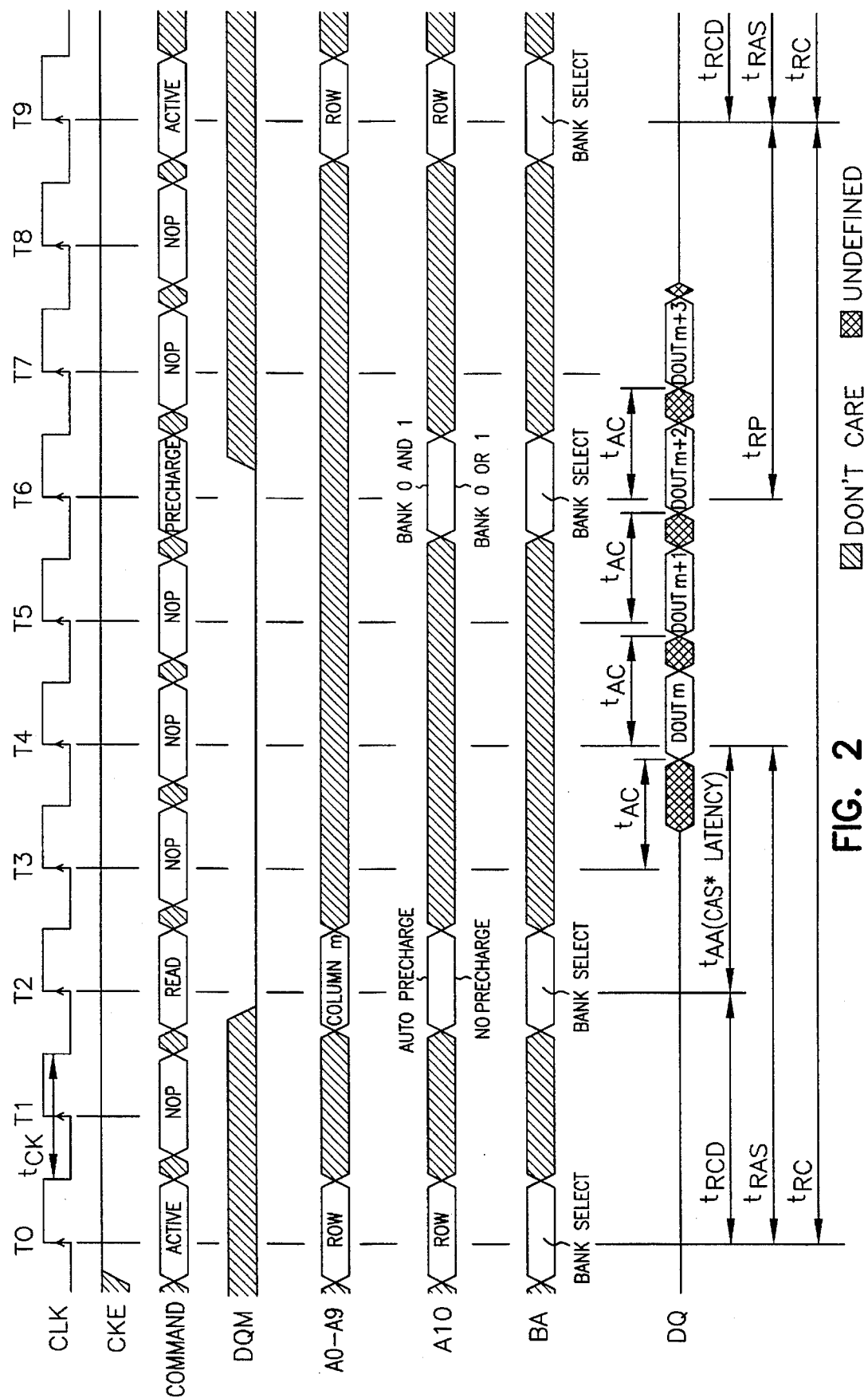
FIG. 2 is a timing diagram illustrating a four cycle read burst transfer operation.

A four cycle burst read operation is illustrated in timing diagram form in FIG. 2. As illustrated, the system clock cycle time is indicated by $t_{CK}$. The time from the initiation of an ACTIVE command to the initiation of a READ command is representing by $t_{RCD}$ and represents two clock cycles, such a between time $t_0$ and time $t_2$. The total read burst transfer cycle period is represented by $t_{RC}$ and represents nine clock cycles as illustrated in FIG. 2. The total ACTIVE command period, wherein the row address strobe is active, is represented by $t_{RAS}$, and represents four clock cycles as illustrated in FIG. 2. The READ access time for each cycle burst in represented by $t_{AC}$. The time from the initiation of the READ command to the DQ clock first data-out cycle is represented by $t_{AA}$ and indicates the column address strobe latency period and is two clock periods as illustrated in FIG. 2. The PRECHARGE command period ($t_{RP}$) is three system clock cycles as illustrated in FIG. 2.

As illustrated in FIG. 2, an ACTIVE command is initiated by command controller 28 at time $t_0$; the corresponding READ command is initiated at time $t_2$; the first cycle burst of data is output at time $t_4$; and the last of the four cycle data bursts is output at time $t_7$. At time $t_6$, a PRECHARGE command is initiated when the second to last data burst is output, and the next ACTIVE command is initiated at time $t_9$, three clock cycles after the PRECHARGE command at time $t_6$.

Figure 3:
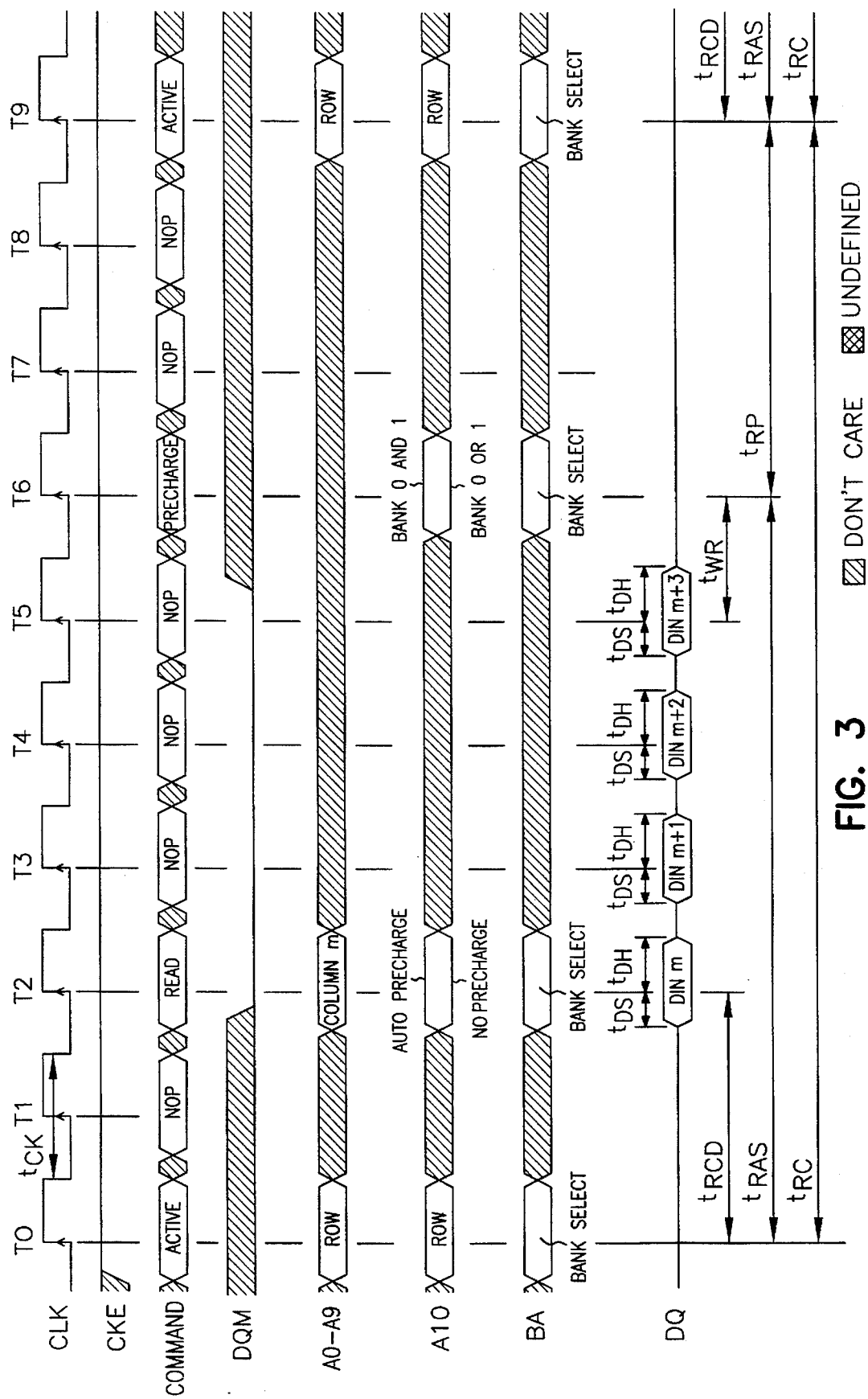
FIG. 3 is a timing diagram illustrating a four cycle write burst transfer operation.

A four cycle burst write transfer operation is illustrated in timing diagram form in FIG. 3. The timing diagram of FIG. 3 is similar to the timing diagram of FIG. 2 illustrating the four cycle READ burst transfer operation. Therefore, only the differences between the WRITE and READ commands are now described. During a WRITE operation, the data-in setup time is represented by $t_{DS}$, and the data-in hold time is represented by $t_{DH}$. The write recovery time is indicated by $t_{WR}$, which represents one clock cycle in FIG. 3 between $t_5$ and $t_6$.

The time from when the WRITE command is initiated at $t_2$ to when the write recovery time is completed after four data bursts have been written into one of the bank memory arrays represents four clock cycles as illustrated in FIG. 3 between $t_2$ and $t_6$. Thus, as with the four cycle read burst transfer operation, the total command period ($t_{RC}$) is again equal to nine clock cycles for the four cycle write burst transfer operation.

Both FIGS. 2 and 3 represent a four cycle burst transfer operation, but as described above SDRAM 20 preferably can be programmed to perform 2, 4, 8, or full page cycle burst operations and the present invention is not limited to a four burst transfer operation.

Figure 4:
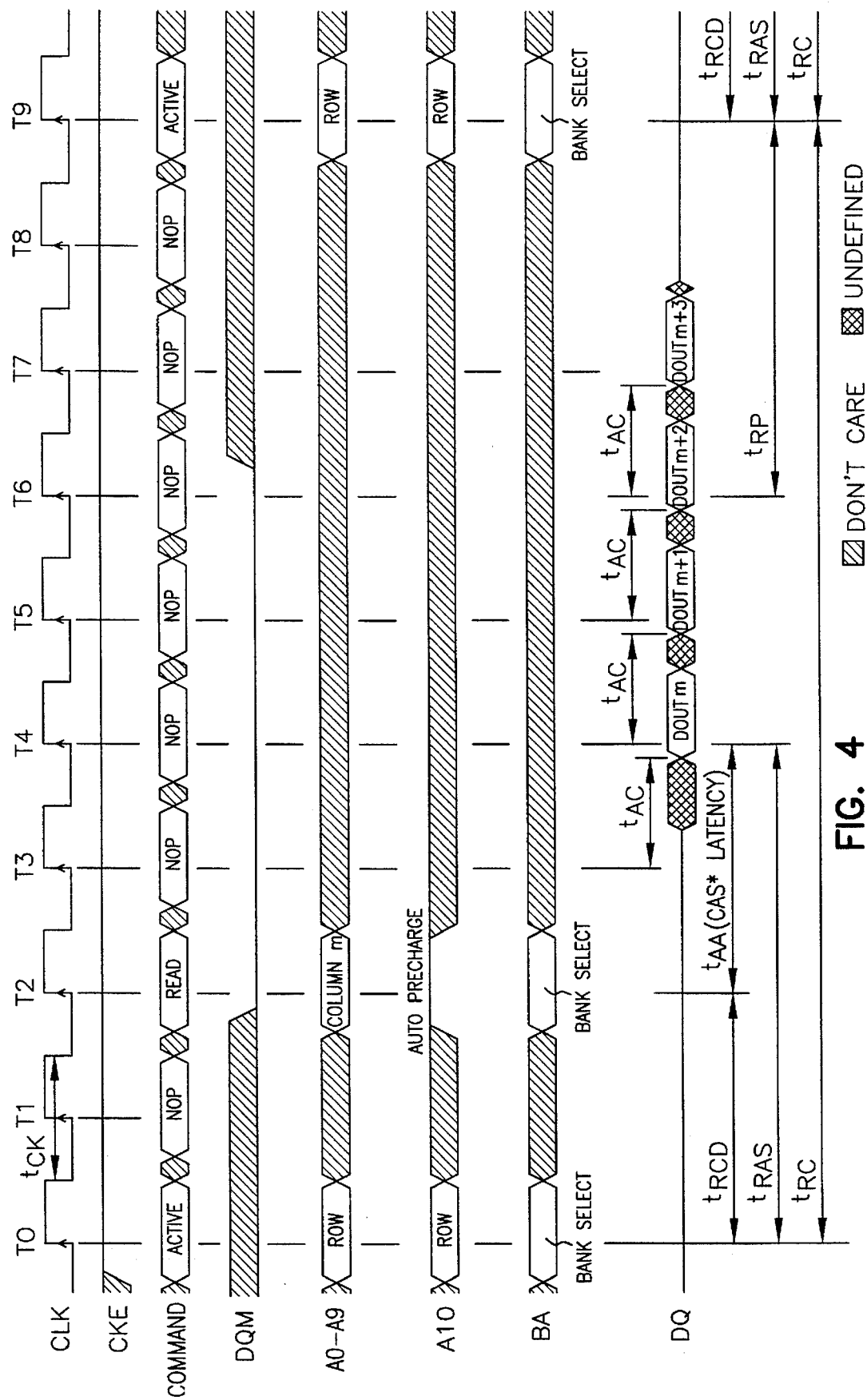
FIG. 4 is a timing diagram illustrating a four cycle read burst transfer operation implementing an AUTO-PRECHARGE command following a READ command.

A four cycle read burst transfer operation which utilizes a programmed READ command which automatically issues an AUTO-PRECHARGE command without having to issue and an actual PRECHARGE command is illustrated in FIG. 4 in timing diagram form. FIG. 4 is similar to FIG. 2 except at time $t_6$ a NOP command is issued rather than the PRECHARGE command since at time $t_6$ the AUTO-PRECHARGE command is internally performed. A similar modification could be made to FIG. 3 to illustrate an AUTO-PRECHARGE command following a WRITE command.

In SDRAM's, such as SDRAM 20, which comprise two bank memory arrays, interleaving between the two open bank memory arrays increases the probability of "Page Hits." The interleaving between open bank memory arrays coupled with the high-speed burst mode READ command and WRITE command operations may, in many cases, provide a "seamless" flow of data. Prior art SDRAMs, however, require an extra dead cycle or wait cycle when interleaving between bank memory arrays when performing read or write burst transfer operations comprising random accesses wherein new pages are accessed.

SDRAM 20 according to the present invention includes a special program option programmed into mode register 40 during the SET MODE REGISTER command to solve this problem to thereby reduce and improve the cycle time on random interleave accesses to eliminate the extra dead cycle during read or write burst transfer operations. The special program option in mode register 40 causes command controller 28 to internally generate an AUTO-PRECHARGE command to the bank memory array which is currently bursting, even on full page read or write burst transfer operations, in the same system clock cycle that the other bank memory array receives either a READ or WRITE command.

FIG. 5 represents a simplified timing diagram to illustrate the above described problem in a conventional SDRAM interleaving sequence for a READ command burst transfer operation comprising random accesses. This interleaving sequence is shown for a four cycle read burst transfer operation for illustrative purposes only, and could be shown for any length burst including full page. In addition, the illustrated example could also be applied to any WRITE command burst transfer operation.

As illustrated in FIG. 5, at time $T_1$ the ACTIVE command is initiated. At time $T_3$, the READ command is initiated for bank 0 memory array 22. At time $T_5$, data from the first of the four burst cycles is output from the conventional SDRAM. Correspondingly, at time $T_6$, $T_7$, and time $T_8$, the data from the other three burst cycles is read from bank 0 memory array 22. At time $T_5$, when the first burst cycle of data is output from bank 0 memory array 22, an ACTIVE command is initiated in bank 1 memory array 24. At time $T_7$, a PRECHARGE command is initiated in bank 0 memory array 22. At time $T_8$, a READ command is initiated in bank 1 memory array 24. Only one command can be initiated based on the decoding the CS*, WE*, CAS*, and RAS* signals along with the bank selection with the BA signal. Thus, the PRECHARGE command for bank 0 memory array 22 is initiated at time $t_7$, and the bank 1 memory array 24 READ command is initiated at $T_8$, which results in a wasted system clock cycle.

This pattern of interleaving repeats with data being output from conventional SDRAM at time $T_{10}$, $T_{11}$, $T_{12}$, and $T_{13}$ from bank 1 memory array 24 resulting from the READ command at time $t_8$. An ACTIVE command is initiated at time $t_{11}$ in bank 0 memory array 22. The PRECHARGE command is initiated at time $t_{12}$ for bank 1 memory array 24. The READ command is again initiated at time $t_{13}$ for bank 0 memory array 22 after the PRECHARGE command in bank 1 memory array 24. Correspondingly, data is output at time $t_{15}$, $t_{16}$, $t_{17}$, and $t_{18}$. And continuing in the interleaving sequence, an ACTIVE command is initiated for bank 1 memory array 24 at time $t_{15}$ and the corresponding READ command is initiated at time $t_{18}$ for bank 1 memory array 24.

FIG. 6 illustrates the operation of SDRAM 20 according to the present invention with the additional special program option in mode register 40 to eliminate the wasted cycle between the PRECHARGE command at time $t_7$ and the READ command at time $t_8$. As illustrated in FIG. 6, the ACTIVE command is again initiated at time $t_1$ for bank 0 memory array 22, and the READ command is initiated at time $t_3$ for bank memory array 22. Similarly, an ACTIVE command is then initiated for bank 1 memory array 24 at time $t_5$. In SDRAM 20 according to the present invention, however, the ACTIVE command initiated at time $t_5$ for bank 1 memory array 24, also automatically triggers command controller 28 to internally initiate an AUTO-PRECHARGE command at time $t_7$. The READ command initiated for bank 1 memory array 24 at time $t_7$ does not conflict with the AUTO-PRECHARGE command initiated as a result of the ACTIVE command at time $t_5$ because the command decoder does not need to decode the CS*, WE*, CAS*, WAS*, and BA signals for the internally and automatically initiated AUTO-PRECHARGE command. In this way, the switching between bank 0 memory array 22 and bank 1 memory array 24 is achieved in one less clock cycle.

In the embodiment of the present invention illustrated in FIG. 6, the next ACTIVE command for the bank 0 memory array 22 is initiated at time $t_{10}$. Since a READ command must follow two cycles later than the ACTIVE command, there is no conflict between the ACTIVE command at time $t_{10}$, the PRECHARGE command at time $t_{11}$, and the READ command at time $t_{12}$, as far as inputting the CS*, WE*, CAS*, WAS*, and BA signals to be decoded by command decoder 26. If the ACTIVE command at time $t_{10}$ could be initiated at time $t_9$, then there would be a need to again perform the AUTO-PRECHARGE command according to the present invention based on the ACTIVE command to the new bank memory array so that the READ and AUTO-PRECHARGE commands could be initiated at time $t_{11}$ to eliminate another cycle in the transfer operation.

In any event, the dead cycle or wait cycle at time $t_9$ illustrated in FIG. 5 for a conventional SDRAM between data out from bank 0 memory array 22 and data out at time $t_{10}$ from bank 1 memory array 24 is eliminated with the present invention.

There are a number of ways to implement the programming feature of the present invention to still permit initiation of an AUTO-PRECHARGE command, as described above, based on an ACTIVE command to a new bank memory array. In one preferred embodiment, command controller 28 analyzes the BA signal and the command input signals WE*, CAS*, and RAS* along with CS* signal to initiate the AUTO-PRECHARGE command if the new ACTIVE command operation is to be performed in a different bank memory array than the previous READ or WRITE command transfer operation.

In another preferred embodiment of the present invention, a special ACTIVE command is programmed into mode register 40 during the SET MODE REGISTER command at start-up. This special ACTIVE command needs to be applied by the user just as with the special programmable READ or WRITE command to initiate an AUTO-PRECHARGE command. In this preferred embodiment, the ACTIVE command at time $t_5$ is replaced by the special ACTIVE command.

Thus, in the first preferred embodiment, the user is not required to initiate a special ACTIVE command manually when switching bank memory arrays, but does need to program, at start up, the initiation of the AUTO-PRECHARGE command based on an ACTIVE command when switching between bank memory arrays. With the special. ACTIVE command of the second preferred embodiment of the present invention, the user of SDRAM 20 needs to manually provide the special ACTIVE command in place of the normal ACTIVE command when switching banks to take advantage of the AUTO-PRECHARGE command to the other bank memory array based on the special ACTIVE command. In either of the above described preferred embodiments, the AUTO-PRECHARGE command and the transfer READ or WRITE transfer operation can be initiated by command controller 28 in the same the system clock cycle.

In another preferred form of the present invention, the above described AUTO-PRECHARE command initiated at time $t_7$ to the bank 0 memory array during the READ or WRITE transfer command to the bank 1 memory array, as illustrated in FIG. 6, is not initiated based on the ACTIVE command at time $t_5$. Instead the AUTO-PRECHARGE command is initiated at time $t_7$ based on a special READ or WRITE transfer command initiated at time $t_7$. In this preferred embodiment, only the special READ or WRITE command needs to be decoded by command decoder 26 at time $t_7$, because both the transfer operation and the precharge operation are initiated at time $t_7$ as a result of the CS*, WE*, CAS*, and RAS* command signals indicating a special READ or WRITE command. The special READ and WRITE commands are programmed into mode register 40 during the SET MODE REGISTER command at start-up. The special READ or WRITE command needs to be manually applied by the user in place of the normal READ or WRITE command to initiate an AUTO-PRECHARGE to the other bank memory array command in this alterative form of the present invention.

The present invention is not limited to a SDRAM having only two bank memory arrays. Thus, SDRAM 20 according to the present invention is alternatively embodied in a SDRAM having more than the shown bank 0 and bank 1 memory arrays, such as four (banks 0–3) or eight (banks 0–7) bank memory arrays. In such a more than two bank embodiment, the above described AUTO-PRECHARGE command operation to the bank 0 memory array during the READ or WRITE transfer command to the bank 1 memory array, as illustrated in FIG. 6, is applied to any selected two of the multiple bank memory arrays.

In one embodiment of a more than two bank form of the present invention, an AUTO-PRECHARGE is initiated at time $t_7$, represented in FIG. 6 in a predefined closest bank memory array to the bank memory array having the READ or WRITE command initiated at time $t_7$. For example, if the bank 2 memory array has a READ or WRITE transfer command operation initiated at time $t_7$, the AUTO-PRECHARGE command applied at time $t_7$ is initiated in the bank 1 memory array, or if the bank 4 memory array has a READ or WRITE transfer command operation initiated at time $t_7$, the AUTO-PRECHARGE command applied at time $t_7$ is initiated in the bank 3 memory array.

In another embodiment of a more than two bank form of the present invention, an AUTO-PRECHARGE is initiated at time $t_7$, represented in FIG. 6, in the most recently accessed bank memory array instead of the predefined closest bank memory array. For example, if the bank 2 memory array is accessed most recently prior to a READ or WRITE transfer command being initiated in the bank 4 memory array, the AUTO-PRECHARGE command applied at time $t_7$ is initiated in the bank 2 memory array (i.e., the previously accessed bank memory array) instead of the bank 3 memory array (i.e., the predefined closest bank memory array).

In any of the above described preferred embodiments, or in other implementations under the scope of the present invention, the wasted clock cycle, illustrated at $t_9$ in FIG. 5 for a conventional SDRAM, is eliminated to improve cycle time on random interleave accesses. For example, in the embodiment illustrated in FIG. 6, the interleave transfer operation sequence to read data from or write data to both of the bank memory arrays is performed in 12 system clock cycles in SDRAM 20 of the present invention, instead of the 13 clock cycles required to perform the same interleave transfer operation sequence in the prior art SDRAM illustrated in FIG. 5. In other words, this results in a 8% performance increase on either READ or WRITE transfer operations during an random interleave access.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. A memory device responsive to command signals and operating in synchronization with active edges of a system clock, the memory device comprising:

a first bank memory array having storage cells organized in rows and columns for storing dam;

a second bank memory array having storage cells organized in rows and columns for storing dam; and a command decoder/controller responsive to selected command signals to initiate, at a first active edge of the system clock, a first command controlling a first operation on the first bank memory array and to initiate, at a second active edge of the system clock, a transfer command controlling a transfer operation for transferring dam to or from the first bank memory array, and responsive to the fist command to automatically initiate at the second active edge of the system clock, a third command controlling a third operation on the second bank memory array.

2. The memory device of claim 1 further comprising a mode register for storing mode information, wherein the command decoder/controller initiates the third command in response to the first command based on the mode information.

3. The memory device of claim 2 wherein the mode register is programmable.

4. The memory device of claim 1 wherein the first command is an active command and wherein the first operation includes latching a value representing a row address of the first bank memory array and activating the addressed row of storage cells in the first bank memory array.

5. The memory device of claim 4 wherein the third command is initiated based on the active command to the first bank memory array being initiated during a second bank transfer operation for transferring data to or from the second bank memory array.

6. The memory device of claim 4 wherein the active command is a special type of two types of active commands including a special type and a normal type, wherein the normal type active command does not trigger the automatic initiation of the third command, and the special type active command does trigger the automatic initiation of the third command.

7. The memory device of claim 1 wherein the third command is a precharge command and wherein the third operation includes precharging and deactivating the second bank memory array.

8. The memory device of claim 1 wherein the transfer command is a read command and the transfer operation reads data from a storage cell in the first bank memory array.

9. The memory device of claim 1 wherein the transfer command is a write command and the transfer operation writes data to a storage cell in the first bank memory array.

10. The memory device of claim 1 wherein the memory device is a synchronous dynamic random access memory.

11. The memory device of claim 1 wherein the memory device comprises more than two bank memory arrays, and wherein the second bank memory array is predefined as a closest bank memory array to the first bank memory array.

12. The memory device of claim 1 wherein the memory device comprises more than two bank memory arrays, and wherein the second bank memory array is the most recently accessed bank memory array prior to the initiation of the transfer command to the first bank memory array.

13. A method of initiating commands in a memory device responsive to command signals and operating in synchronization with active edges of a system clock, the method comprising the steps of:

initiating, at a first active edge of the system clock, in response to selected command signals, a first command controlling a first operation on a first bank memory array;

initiating, at a second active edge of the system clock, in response to selected command signals, a transfer command controlling a transfer operation for transferring data to or from the first bank memory array; and automatically initiating, at the second active edge of the system clock, in response to the first command, a third command controlling a third operation on a second bank memory array.

14. The method of claim 13 wherein the first command is an active command and wherein the first operation includes the steps of latching a value representing a row address of the first bank memory array and activating the addressed row of storage cells in the fast bank memory array.

15. The method of claim 14 wherein the third command is initiated based on the active command to the fast bank memory array being initiated during a second bank transfer operation for transferring data to or from the second bank memory array.

16. The method of claim 14 wherein the active command is a special type of two types of active commands including a special type and a normal type, wherein the normal type active command does not trigger the automatic initiation of the third command, and the special type active command does trigger the automatic initiation of the third command.

17. The method of claim 13 wherein the third command is a precharge command and wherein the third operation includes the steps of precharging and deactivating the second bank memory array.

18. The method of claim 13 wherein the transfer command is a read command and the transfer operation includes the step of reading data from a storage cell in the first bank memory array.

19. The method of claim 13 wherein the transfer command is a write command and the transfer operation includes the step of writing data to a storage cell in the first bank memory array.

20. The method of claim 13 wherein the memory device comprises more than two bank memory arrays, and wherein the method further comprises the step of predefining the second bank memory array as a closest bank memory array to the first bank memory array.

21. The method of claim 13 wherein the memory device comprises more than two bank memory arrays, and wherein the second bank memory array is the most recently accessed bank memory array prior to the initiation of the transfer command to the first bank memory array.

22. A memory device responsive to command signals and operating in synchronization with active edges of a system clock, the memory device comprising:

a first bank memory array having storage cells organized in rows and columns for storing data;

a second bank memory array having storage cells organized in rows and columns for storing dam; and a command decoder/controller responsive to selected command signals to initiate, at a first active edge of the system clock, an active command controlling an active operation which includes latching a value representing a row address of the first bank memory array and activating the addressed row of storage cells in the first bank memory array, and responsive to the active command to automatically initiate at a second active edge of the system clock, a precharge command controlling a precharge operation which includes precharging and deactivating the second bank memory array.

23. The memory device of claim 22 wherein the command decoder/controller is responsive to selected command signals to initiate, at the second active edge of the system clock, a transfer command controlling a transfer operation for transferring data to or from the fast bank memory array.

24. The memory device of claim 23 wherein the transfer command is a read command and the transfer operation reads data from a storage cell in the first bank memory array.

25. The memory device of claim 23 wherein the transfer command is a write command and the transfer operation writes data to a storage cell in the first bank memory array.

26. The memory device of claim 22 further comprising a mode register for storing mode information, wherein the command controller initiates the precharge command in response to the active command based on the mode information.

27. The memory device of claim 26 wherein the mode register is programmable.

28. The memory device of claim 22 wherein the precharge command is initiated based on the active command to the first bank memory array being initiated during a second bank transfer operation for transferring data to or from the second bank memory array.

29. The memory device of claim 22 wherein the active command is a special type of two types active of commands including a special type and a normal type, wherein the normal type active command does not trigger the automatic initiation of the precharge command, and the special type active command does trigger the automatic initiation of the precharge command.

30. The memory device of claim 22 wherein the memory device is a synchronous dynamic random access memory.

31. The memory device of claim 22 wherein the memory device comprises more than two bank memory arrays, and wherein the second bank memory array is predefined as a closest bank memory array to the first bank memory array.

32. The memory device of claim 22 wherein the memory device comprises more than two bank memory arrays, and wherein the second bank memory array is the most recently accessed bank memory array prior to the initiation of the transfer command to the first bank memory array.

33. A method of initiating commands in a memory device responsive to command signals and operating in synchronization with active edges of a system clock, the method comprising the steps of:

initiating, at a first active edge of the system clock, in response to selected command signals, an active command controlling an active operation;

performing the active operation which includes the steps of latching a value representing a row address of a first bank memory array and activating the addressed row of storage cells in the first bank memory array;

initiating, at a second active edge of the system clock, in response to selected command signals, a transfer command controlling a transfer operation for transferring data to or from the first bank memory array; and automatically initiating, at the second active edge of the system clock, in response to the active command, a responsive to the active command a precharge command controlling a precharge operation; and performing the precharge operation which includes the steps of precharging and deactivating a second bank memory array.

34. The method of claim 33 further comprising the steps of:

initiating, at a second active edge of the system clock, in response to selected command signals, a transfer command controlling a transfer operation; and performing the transfer operation which includes transferring data to or from the first bank memory array.

35. A memory device responsive to command signals and operating in synchronization with active edges of a system clock, the memory device comprising:

a first bank memory array having storage cells organized in rows and columns for storing data;

a second bank memory array having storage cells organized in rows and columns for storing data; and a command decoder/controller responsive to selected command signals to initiate, at a first active edge of the system clock, a special transfer command controlling a transfer operation for transferring data to or from the first bank memory array, and to automatically initiate at the first active edge of the system clock, a second command controlling a second operation on the second bank memory array.

36. The memory device of claim 35 wherein the second command is a precharge command and wherein the second operation includes precharging and deactivating the second bank memory array.

37. The memory device of claim 35 wherein the transfer command is a read command and the transfer operation reads data from a storage cell in the first bank memory array.

38. The memory device of claim 35 wherein the transfer command is a write command and the transfer operation writes dam to a storage cell in the first bank memory array.

39. A method of initiating commands in a synchronous memory device responsive to command signals and operating in synchronization with active edges of a system clock, the method comprising the steps of:

initiating, at a first active edge of the system clock, in response to selected command signals, a special transfer command controlling a transfer operation for transferring data to or from a first bank memory array; and automatically initiating, at the first active edge of the system clock, in response to the selected command signals, a second command controlling a second operation on a second bank memory array.

40. The method of claim 39 wherein the second command is a precharge command and wherein the second operation includes the steps of precharging and deactivating the second bank memory array.

41. The method of claim 39 wherein the special transfer command is a Special read command and the transfer operation includes the step of reading data from a storage cell in the first bank memory array.

42. The method of claim 39 wherein the special transfer command is a special write command and the transfer operation includes the step of writing data to a storage cell in the first bank memory array.

* * * * *